(12) United States Patent
Barford

(10) Patent No.: US 7,139,676 B2
(45) Date of Patent: Nov. 21, 2006

(54) REVISING A TEST SUITE USING DIAGNOSTIC EFFICACY EVALUATION

(75) Inventor: Lee A. Barford, San Jose, CA (US)

(73) Assignee: Agilent Technologies, Inc, Santa Clara, CA (US)

( * ) Notice: Subject to any disclaimer, the term of this patent is extended or adjusted under 35 U.S.C. 154(b) by 1003 days.

(21) Appl. No.: 10/053,748

(22) Filed: Jan. 18, 2002

(65) Prior Publication Data

US 2003/0139906 A1 Jul. 24, 2003

(51) Int. Cl.
G06F 11/30 (2006.01)
G06F 15/00 (2006.01)
G21C 17/00 (2006.01)

(52) U.S. Cl. ............... 702/183; 702/81; 702/123; 714/26; 714/33

(58) Field of Classification Search ............ 702/81, 702/123, 182, 183; 714/26, 33, 47, 738, 714/744; 395/183.09, 183.02; 371/15.1; 700/26, 177; 703/6, 13, 14; 707/102, 104.1
See application file for complete search history.

(56) References Cited

U.S. PATENT DOCUMENTS

| | | | | |
|---|---|---|---|---|
| 5,130,936 | A | * | 7/1992 | Sheppard et al. ............ 702/123 |
| 5,544,308 | A | | 8/1996 | Giordano et al. |
| 5,808,919 | A | | 9/1998 | Preist et al. |
| 5,922,079 | A | | 7/1999 | Booth et al. |
| 6,167,352 | A | * | 12/2000 | Kanevsky et al. ............ 702/81 |

FOREIGN PATENT DOCUMENTS

| | | |
|---|---|---|
| EP | 0 887 733 | 6/1998 |
| EP | 1 136 912 | 1/2001 |

OTHER PUBLICATIONS

Daniel Bell et al—Using Causal Reasoning for Automated Failure Modes and Effects Analysis (FMEA); Reliability and Maintainability Symposium, 1992; Proceedings, Annual Las Vegas, Nevada, USA, Jan. 21-23, 1992; New York, NY, USA, IEEE, US; Jan. 21, 1992, pp. 343-353, XP010058370; ISBN: 0-7803-0521-3.
Chrysler Corporation, Ford Motor Company, General Motors Corporation: "Potential Failure Mode and Effects Analysis (FMEA)—Reference Manual"; 1995, Carwin Continuous Ltd., Essex, England XP002240667; pp. 27-45, 51, 53.
European Search Report dated May 9, 2003—2Pages.

* cited by examiner

Primary Examiner—Bryan Bui
Assistant Examiner—John Le

(57) ABSTRACT

A method and a system evaluate an efficacy of a test suite in a model-based diagnostic testing system to determine a revision of the test suite. The evaluation comprises suggesting a test to be added to the test suite based on probabilities of a correct diagnosis and an incorrect diagnosis. The evaluation either alternatively or further comprises identifying a test to be deleted from the test suite based on probabilities of a correct diagnosis for the test suite and for a modified test suite that does not include a test. An efficacy value of each test in the test suite is computed. The system has a computer program comprising instructions that implement an evaluation of diagnostic efficacy of the test suite. The system either is a stand-alone system or is incorporated into the testing system.

30 Claims, 3 Drawing Sheets

REVISING A TEST SUITE USING DIAGNOSTIC EFFICACY EVALUATION

TECHNICAL FIELD

The invention relates to testing of a device under test. In particular, the invention relates to diagnostic test systems and tests to be used therewith.

BACKGROUND ART

Testing of a device is normally an integral part of the design, manufacture and maintenance of the device. Testing is routinely employed during the design of a new device to establish reliability and an operational capability of the device. In manufacture, testing establishes and/or quantifies operability of the device as well as facilitates yield improvements through failure diagnosis. Once the device is deployed, testing helps to maintain the device by detecting potential failures and diagnosing the cause or causes of failures of the device or its components.

In most cases, testing comprises performing a set or sequence of tests on the device under test (DUT). Such a set of tests or test suite typically employs one or more pieces of test equipment. Together, the test equipment and the test suite are referred to as a testing system. In some cases the testing system comprises a complex, integrated and highly automated system. In other cases, the testing system is only loosely integrated and many, if not all, of the tests are performed manually. In yet other cases, a testing subsystem is built into the DUT and functions as a built-in self-test for the DUT. As used herein, the term 'testing system' includes all such testing systems including a built-in testing subsystem of the DUT.

However, while testing systems vary widely according to the DUT and the application of the testing system, at some basic level all testing systems generally attempt to determine whether a given DUT is GOOD or BAD. A GOOD DUT is one that passes the tests administered by the testing system while a BAD DUT is one that fails one or more of the tests. Since DUTs generally are made up of one or more components, a secondary goal of many testing systems is to diagnose which component or components of the DUT is responsible the DUT being BAD. Thus, many testing systems include some form of a diagnostic system that performs a component or subsystem level diagnosis of failures encountered during testing. A DUT with a built-in test subsystem also may feature a built-in self-diagnostic capability.

For example, a given DUT typically includes a variety of components. Such components include, but are not limited to, integrated circuits, electrical components, battery subsystems, mechanical components, electrical buses, wiring components, and wiring harnesses. Any one or more of these components may fail and cause the failure of the DUT. The role of the diagnostic system portion of the testing system is to attempt to pinpoint the component or components that most likely caused the encountered failure or failure mode of the DUT.

Typically, diagnostic systems of testing systems either employ a fault tree approach to produce a diagnosis or attempt to extract a diagnosis from a combination of results of functional tests used to verify DUT functionality. In simple terms, a fault tree is a flow chart of tests to perform and related diagnoses. Tests are performed at each of a series of decision blocks of the flow chart. At each decision block, results of the test performed determine which of a plurality of branches leading out of the decision block is to be taken. Branches either lead to additional decision blocks or to stop blocks. Stop blocks give a diagnosis and represent an end point of the fault tree. Typically the stop blocks are annotated with the diagnosis (e.g., a name of a failed component) or with "no diagnosis is possible" indication. Thus, when a stop block is reached, the annotation gives the diagnosis. In general, only enough tests necessary to reach a stop block giving a diagnosis are performed when a fault tree is employed. Typically, fault trees are designed to mimic a decision-making process followed by a skilled test technician.

On the other hand, diagnostic systems based on the results of functional tests typically require that all tests of a predetermined set or test suite be performed before an attempt at a diagnosis can be made. Moreover, many such diagnostic systems employ a model or models of the DUT. As used herein, a model-based diagnostic system is defined as a diagnostic system that renders conclusions about the state or failure mode of the DUT using actual DUT responses to applied functional tests that are compared to expected responses to these tests produced by a model of the DUT. Often, the model is a computer-generated representation of the DUT that includes specific details of interactions between components of the DUT.

Selecting a suite of tests to perform is an important step in using model-based diagnostic testing systems. Performing too few tests or performing the wrong tests can lead to an inability to arrive at a diagnosis or even an incorrect diagnosis. In other words, a poorly designed test suite may not provide a particularly effective or reliable diagnosis of a DUT failure. In particular, for a given test suite, simply adding tests may not improve the diagnostic efficacy of the test system. Thus, often the problem is how to choose additional tests to add to the suite to increase diagnostic efficacy.

On the other hand, performing too many tests is potentially costly in terms of time and test equipment needed to arrive at a diagnosis. Moreover, some of the tests may be redundant and add little if anything to the diagnostic accuracy of the test system. In particular, many tests performed on a DUT can take an appreciable amount of time to perform and/or require the use of expensive equipment. If performing such tests does not increase the diagnostic efficacy of the testing system, the tests might just as well be eliminated. In such situations, the problem is one of determining which tests of a test suite may be eliminated without significantly reducing diagnostic efficacy.

Accordingly, it would be advantageous to be able to examine a test suite to determine what tests might be added to improve the diagnostic efficacy of the testing system. Likewise, it would be useful to be able to determine which tests in a test suite are redundant or have little added diagnostic value and, therefore, can be safely eliminated from the suite. Such abilities would address a longstanding need in the area of model-based diagnostic testing systems.

SUMMARY OF THE INVENTION

According to the present invention, a revision of a test suite of a diagnostic testing system is determined by evaluating diagnostic efficacy and accuracy of the test suite. In particular, the present invention suggests tests to add to the test suite that may improve diagnostic efficacy and accuracy of the testing system. Adding the suggested test or tests improves the ability of the testing system to accurately diagnosis a failure detected in a device under test (DUT).

The present invention alternatively or further establishes a relative diagnostic value of tests in a test suite of the testing system. The diagnostic value of the tests identifies tests that may be deleted from the test suite with minimal impact on an overall diagnostic efficacy of the test suite. In particular, tests determined to have a low relative efficacy value may be eliminated without adversely affecting overall diagnostic efficacy to reduce a cost, a complexity, and/or a redundancy of the tests performed by the testing system according to the present invention. The present invention is applicable to virtually any model-based diagnostic testing system, but is particularly well suited for use in conjunction with automated testing systems, especially those used to test electronic systems.

In an aspect of the present invention, a method of suggesting a test to add to a test suite of a diagnostic testing system is provided. In particular, the method suggests a potential test to add to the test suite and provides an indication of a relative increase in an overall diagnostic efficacy of the test suite associated with adding such a test to the test suite. In some embodiments, the suggested test is defined by a coverage that the test provides over one or more components in the DUT. The relative increase in overall diagnostic efficacy is provided as a 'score' for each suggested test. In some embodiments, a list of suggested tests is generated that includes an assigned score for each suggested test in the list, thereby enabling a choice of which test or tests to add based on the score and other factors, such as constraints imposed by the DUT and/or available test equipment.

The method of suggesting a test to add comprises creating a simulation database for the DUT and the test suite. The method of suggesting a test to add further comprises determining from the simulation database a probability of correct and incorrect diagnoses for the test suite. The probabilities of correct and incorrect diagnoses are preferably determined for as many combinations of correct and incorrect diagnoses as are possible for the DUT. The method of suggesting a test to add further comprises suggesting a test to add from the determined probabilities. Suggesting comprises creating a list of suggested tests to be added to the test suite. In some embodiments, each suggested test on the list is provided in terms of what component(s) of the DUT it covers.

In another aspect of the present invention, a method of identifying a test to delete from a test suite is provided. Advantageously, the method determines diagnostic efficacies of tests of the test suite. In particular, the method of identifying generates a list of tests, each test on the list being associated with a relative diagnostic efficacy or diagnostic value of the test. The list may be used to identify the test that may be safely eliminated as having low diagnostic efficacy.

The method of identifying a test to delete comprises creating a simulation database for the DUT and the test suite. The method further comprises determining a probability of a correct diagnosis using the test suite. The method further comprises determining a probability of a correct diagnosis for a modified test suite. The modified test suite is the test suite with a selected test deleted from the suite. Determining a probability of correct diagnosis for the modified test suite is preferably repeated with a different one of the tests in the test suite being the selected test that is deleted. The method further comprises computing an efficacy value for each of the tests in the test suite. The method further comprises identifying a test to delete from the determined probabilities and computed efficacy values. Identifying comprises generating a list of the tests and associated efficacy values. Tests with low efficacy values may be deleted from the suite without significantly reducing the overall diagnostic efficacy of the test suite.

In yet another aspect of the present invention, a system that determines a diagnostic efficacy of a test suite of a testing system is provided. The system determines an efficacy of tests in a test suite and either or both suggests tests to add and identifies tests to delete from the test suite. The system comprises a processor, a memory and a computer program stored in the memory. The processor accesses the computer program from memory and executes the computer program. The computer program comprises instructions that when executed determine the efficacy of tests in a test suite. The instructions may further suggest tests to add and/or identify a test to delete from the test suite. In a preferred embodiment, the instructions implement the method of the present invention. The system of the present invention may be a stand-alone system or may be incorporated into a testing system for testing a DUT.

A key advantage of the present invention is that it provides quantitative information upon which to base decisions about which test(s) to add or remove from a test suite. In particular, the present invention effectively 'discovers' problems associated with diagnostic accuracy of a test suite and automatically suggests tests to add to the test suite to address those problems. Moreover, the present invention associates a relative amount of improvement in diagnostic accuracy with suggested tests facilitating an evaluation of the advantages of adding such tests. Furthermore, the present invention quantifies the efficacy of tests in the test suite, thereby enabling the identification of test(s) that can be removed from a test suite while minimally reducing the effectiveness of the suite. Removing identified tests may result in reducing test time while minimally impacting the effectiveness of the test suite.

Certain embodiments of the present invention have other advantages in addition to and in lieu of the advantages described hereinabove. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

Figure 1:
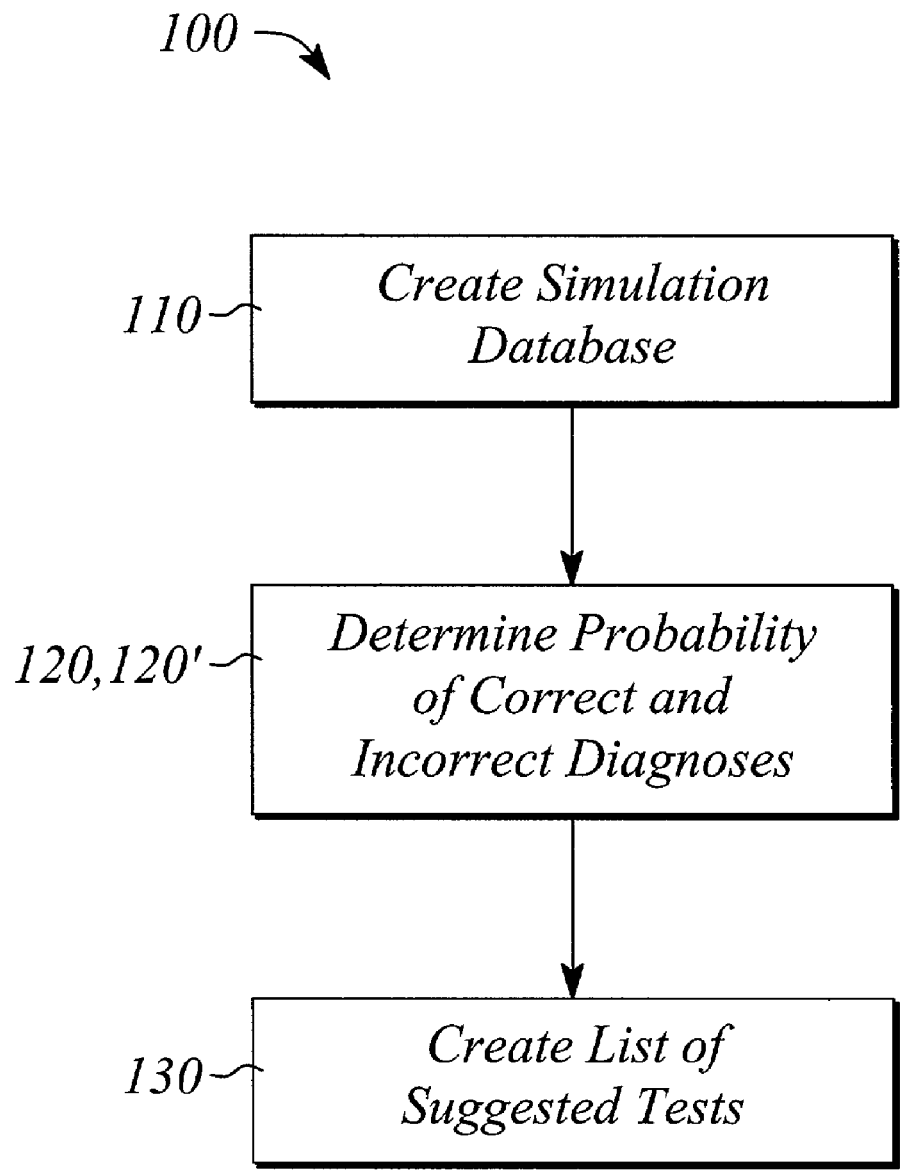
FIG. 1 illustrates a flow chart of a method of suggesting a test to add to a test suite of a diagnostic testing system according to an embodiment of the present invention.

The present invention determines a revision of a test suite of a testing system used for diagnostic testing of a device under test (DUT) using an evaluation of diagnostic efficacy of the test suite and constituent tests thereof. In particular, the present invention can suggest a test or tests to add to the test suite to improve diagnostic efficacy of the test suite. Furthermore, the present invention can identify a test or tests of the test suite that have low diagnostic efficacy and therefore may be deleted from a test suite with minimal reduction in overall diagnostic efficacy.

The present invention employs a measure of diagnostic effectiveness or efficacy of the test suite and of tests that make up the test suite. The measure of efficacy according to the present invention enables the identification of characteristics of a test that, when added to the test suite, improves the overall accuracy of diagnostic testing performed by the testing system. Similarly, the measure of efficacy facilitates identifying a test of the test suite that has low relative diagnostic value compared to the test suite as a whole. A test with low diagnostic value often may be eliminated or deleted from the test suite without significantly reducing the diagnostic efficacy of the test suite.

A DUT, as used herein, refers to any of a variety of devices, systems or subsystems, including mechanical, electrical, and chemical systems as well as combinations thereof. Examples of such DUTs include, but are not limited to, circuit boards, entire systems having a plurality of circuit boards, automobiles, satellite receiving systems, chemical manufacturing plants, and even test equipment. In general, a test of the DUT comprises applying a stimulus to one or more inputs of the DUT and measuring a response at one or more outputs of the DUT. A group or set of one or more tests applied to the DUT, and in part, used to diagnose a failure of the DUT, is referred to herein as a 'test suite'.

To facilitate discussion hereinbelow, a DUT is assumed to be made up of one or more (n) separate, well-defined components, where n is an integer greater than or equal to one. For example, such separate, well-defined components in an electrical system include, but are not limited to, integrated circuits, multichip modules, discrete electrical devices, wiring buses, wiring harnesses, power supplies, and circuit boards. A discrete electrical device includes, but is not limited to, a resistor, capacitor, inductor, diode and transistor. Thus, the DUT has n components where n is equal to or greater than one.

Each of the n components of the DUT has two states or operational conditions with respect to testing performed on the DUT. The two states are referred to herein as GOOD and BAD. A component that is in the GOOD state is operating properly while a component that is in the BAD state is not operating properly. In other words, each of the components either is operating properly (i.e., GOOD) or is not operating properly (i.e., BAD) according to the component's specifications. Moreover, it is assumed for the purposes of discussion that the component state does not change during testing by the testing system.

There are m tests in the test suite where m is an integer having a value of zero or more. Each of the m tests acts upon or 'covers' a subset of one or more of the n components of the DUT. The subset of components covered by a particular test may overlap with another subset covered by others of the m tests in the test suite. Thus for $m \geq 1$, if the DUT fails a particular test, it is assumed that at least one of the components of the DUT covered by that particular test is BAD. Furthermore, a 'test coverage' is the subset of components acted upon or covered by a particular test of a test suite.

It is also assumed herein that each of the m tests either passes or fails when applied to the DUT. Therefore, a given test generates one of only two results, namely PASS or P if the test passes and FAIL or F if the test fails. Restricting the test results of a test to only two states, PASS and FAIL, is not limiting since tests that inherently generate a finite number of states greater than two can be treated as a finite number of separate tests each having only two states. The list of tests in a test suite along with the state of the test after it is applied to the DUT is referred to as the 'test results'. Moreover, the tests of the test suite are predefined or given and are typically designed to test DUT functionality.

The DUT and its interaction with the test suite are modeled by a probability of failure of each of the n components, the test coverages of the m tests on the n components, and joint coverages of the m tests on the n components. A joint coverage is an intersection of the coverages of a pair of tests.

The probability of failure of each component may be based on a priori information or derived from actual historical data for the component. A model is employed to generate a statistical simulation of the DUT with respect to the tests of the test suite in the form of a 'prediction table' or 'simulation database'. A Monte Carlo simulation is a type of statistical simulation known in the art. In a preferred embodiment, the simulation database contains a set of entries each having a field for a frequency-of-occurrence value, a field for a test result pattern, and a field for a component state pattern. Such a model and a Monte Carlo simulation database computed from such a model is described in Kanevsky and Barford, U.S. Pat. No. 6,167,352, incorporated herein by reference.

In an alternate embodiment, the simulation database is made up of actual experimental data reflecting historical results of prior tests and component failures. In this embodiment, the model is a count of actual DUTs and the relationships between test failures and actual device failures. In yet another embodiment, the simulation database may be based on a failure mode-effects analysis. Hereinafter, the term 'random number' is meant to include the output of a pseudo-random number generator as well as numbers chosen through some stochastic process.

In an aspect of the invention, a method 100 of suggesting a test to add to a test suite of a diagnostic testing system is provided. The suggested test, if added to the test suite, improves overall diagnostic efficacy of the test suite. FIG. 1 illustrates a flow chart of the method 100 of suggesting a test to add to the test suite according to a preferred embodiment. The method 100 comprises creating 110 a simulation database for the DUT and the test suite. A computer model of the DUT, actual failure data for the DUT, or a combination thereof are employed to create 110 the simulation database. The simulation database, whether based on the computer model, actual failure data, or a combination thereof, preferably includes a field for a component state pattern, a field for a test result pattern, and a field representing a frequency-of-occurrence or number-of-occurrences value for each combination of component state pattern and test result pattern. A preferred embodiment of the creation 110 of the simulation database is described in Kanevsky et al.

In the preferred embodiment, a model-based simulation is performed to create 110 the simulation database. The simulation repetitively generates a component state pattern and determines a test result pattern based on the component state pattern. Each component pattern includes a state for each component (e.g., GOOD or BAD) in the DUT. The state pattern is generated randomly such that whether a given component is GOOD or BAD is based on a random number. Preferably, the state pattern is also based on a probability of failure for each component in the DUT. The state pattern is then applied to the model to determine which test passes or fails based on the state pattern. Each occurrence of a unique pair of component state pattern and test result pattern is counted during the simulation to produce the number-of-occurrences value for the pair. Thus, the database complied from the simulation ultimately comprises a large number of rows, each row having a component pattern, a test pattern and a number-of-occurrences value.

The method 100 of suggesting a test to add further comprises determining 120 from the simulation database a probability of a correct diagnosis and a probability of an incorrect diagnosis. Equivalently, a number-of-occurrences for each of the diagnoses, correct and incorrect, may be determined 120' instead of a probability. The diagnoses are produced using the test patterns of the simulation database. The accuracy of the diagnoses, whether a given diagnosis is correct or incorrect, is determined by comparing the diagnosis produced from the test pattern to an associated component pattern. For example, a correct diagnosis labels a b-th component as BAD when the b-th component is actually BAD according to the component pattern. On the other hand, an example of an incorrect diagnosis labels a d-th component as BAD when, in fact, the b-th component is BAD according to the component pattern.

The probability or number-of-occurrences of correct and incorrect diagnoses are preferably determined 120, 120' for as a many combinations of correct and incorrect diagnoses as are represented in the simulation database. Essentially, determining 120, 120' comprises counting a number-of-occurrences of each of the correct and incorrect diagnoses included in the simulation database. A probability of a given diagnosis may be computed from the count by dividing the number-of-occurrences of the diagnosis by a total number-of-occurrences of all diagnoses included in the determination 120, 120'. In some embodiments, only the probability of incorrect diagnoses is determined 120, 120'.

The method 100 of suggesting a test to add further comprises creating 130 a list of suggested tests. In a preferred embodiment, the list of suggested tests is provided in terms of characteristics of each of the suggested tests. Preferably, the test characteristics include a coverage that the test has on one or more components of the DUT. The list is created 130 by choosing from the diagnoses of the simulation database those incorrect diagnoses having the highest probability or equivalently the highest number-of-occurrences. The list may include one or more suggested tests. Thus, if five suggested tests are desired, the list is created 130 by choosing five incorrect diagnoses in the simulation database having the five highest probabilities.

The list is created 130 by further using information from the chosen incorrect diagnoses to determine a test coverage for each suggested test. For example, information regarding an incorrectly diagnosed BAD component versus an actual BAD component may be used to determine a coverage for a suggested test. In general, a given suggested test coverage preferably has little or no coverage on one component and high coverage on another component. Thus, in a preferred embodiment, the suggested test may be defined by a pair of components and a respective coverage level of the test on these components (e.g., high or low). The suggested test is preferably provided in terms of coverages since the method advantageously 'discovers' that in some cases, the diagnostic test system employing the test suite has difficulty distinguishing between certain pairs of components.

In some other cases, the difficulty in distinguishing may be due to a lack of sufficient coverage of a particular component and not a conflict in the coverages between component pairs. In such cases, the test suggested by the present invention may be defined by a single component needing additional test coverage. A second component is not considered and thus, if pairs of components are reported, a 'don't care' may be used instead of a second component. Thus according to the present invention, the suggested test preferably defines one component for which the suggested test provides high coverage and either another component for which the suggested test should have low coverage or a 'don't care' when another component is not considered. The extension of the method 100 of the present invention to additionally handle suggesting tests involving sets of more than one component is straightforward for one of ordinary skill in the art given the discussion herein. All such extensions are within the scope of the present invention.

In the preferred embodiment, a score is given for each suggested test that shows a relative amount of improvement in diagnostic accuracy that is obtained by adding a suggested test. The score is an approximation to the probability of the 'high coverage' component being the true BAD component when the 'low coverage' component is given as the diagnosis. In addition, the preferred embodiment of the method 100 may also output an estimate of overall diagnostic accuracy of the test suite in the form of a probability of a correct diagnosis to assist in determining an improvement that may result from adding one or more of the suggested tests.

It should be noted that a best suggested test to add to the test suite may be impossible or at least difficult to perform on a given DUT. For example, there may be constraints on the DUT or test equipment that make it impossible to conduct a specific suggested test with the recommended 'high coverage' and 'low coverage' characteristics with respect to the DUT components. Therefore, the method 100 of the present invention preferably produces a list containing more than one suggested test as an output. The user of the present invention advantageously may choose to add to the test suite one or more of the highest scored tests from the list based on a practicality and cost effectiveness of each suggested test. Moreover, the list of suggested tests produced by the present invention may be represented either in human readable form or in machine-readable form. The human-readable form of the list of suggested tests may take any of several common textual or graphical forms known in the art. The machine-readable form may be used by other computer programs or automated systems. Such other computer programs or automated systems may design a test from the suggested test characteristics and/or implement a designed test, for example.

To better understand the method 100 of the present invention, consider an example of an implementation of the preferred embodiment of the method 100 using a matrix representation for storing intermediate results generated by the method 100. The use of matrix notation hereinbelow is intended to facilitate discussion and in no way limits the scope of the present invention. In addition, for the purposes of discussion hereinbelow, it is assumed that a model of the DUT, its components, test coverages, and a priori probabilities of component failure are available.

Using the model, a Monte Carlo simulation is performed and a simulation database is created 110. The model incorporates probabilities of failure for each of the components of the DUT. The example simulation database consists of a table with three columns and a large number of rows. A first column of the table contains component pattern bit strings $\omega$ (e.g., $\omega = \omega_1, \omega_2, \ldots, \omega_n$) that encode which component or components are BAD. Each of the components of the DUT is represented by a unique position i within the component pattern bit string $\omega$ as indicated by the subscripts. The component pattern bit string ω of the first column is also referred to as a 'failed component' bit string ω or simply a component pattern ω hereinbelow. A '1' in an i-th position of the component pattern bit string ω indicates that an i-th component is BAD while a '0' in the i-th position indicates that the i-th component is GOOD. For example, given a component pattern bit string ω having a value of a second bit $\omega_2$ equal to '1', a second component is BAD according to that component pattern.

A second column of the table contains test result pattern bit strings Δ encoding which of the tests of the test suite failed or passed. The bit string Δ (e.g., $\Delta=\Delta_1, \Delta_2, \ldots, \Delta_m$) is also referred to as a 'failed test' bit string Δ or simply a 'test pattern' Δ herein. Each test in the test suite is represented by a unique position i within the test pattern bit string Δ. A '1' in an i-th position of the test pattern bit string Δ indicates that an i-th test failed while a '0' in the i-th position indicates the i-th test passed. For example, a test pattern bit string Δ having values of a third bit $\Delta_3$ and a fifth bit $\Delta_5$ equal to '1' indicates that a third test and a fifth test of the test suite failed.

A third column v of the table records a number of occurrences of a given combination of component pattern bit string ω and test pattern bit string Δ represented by a given row produced during the course of a simulation. The number of occurrences v is an integer greater than or equal to 0. Thus, if a given component pattern bit string ω and test pattern bit string Δ pair is produced twenty times during the simulation, the corresponding number of occurrences v=20. Each row in the table corresponds to a different, unique pattern of GOOD and BAD components or component pattern bit string ω and an associated of test pattern bit string Δ produced by the Monte Carlo simulation. An example of a portion of such a simulation database is presented in Table 1.

TABLE 1

| Component Pattern | Test Pattern | Number of Occurrences |
|---|---|---|
| 0010000 | 00000000000000 | 12 |
| 0100000 | 01000101010101 | 149 |
| 1010010 | 00100100000011 | 35 |
| 1000000 | 01100010010101 | 178 |
| 1000001 | 10101011110001 | 318 |
| 0010000 | 00000000100000 | 24 |
| 0001000 | 00000000000000 | 29 |
| . . . | . . . | . . . |

In addition to generating the above-described simulation database, the example described herein employs a variable E to accumulate a total number of occurrences from which a probability of correct diagnosis is calculated and employs a matrix M having m+1 rows and m columns where m is the number of tests in the example test suite (i.e., number of bits in the test pattern bit string Δ). The matrix M will eventually contain a count of a number of occurrences of each possible diagnosis based on the simulation database. In particular, for $d \leq m$, M(d,b) will contain a number of occurrences in which a d-th component is diagnosed as the BAD component when a b-th component is the actual BAD component. The variable E and all elements of the matrix M are initially set to zero during creating 110.

In the example, determining 120 probabilities of correct and incorrect diagnoses begins by producing a copy of the simulation database containing only those rows from the simulation database that have one and only one BAD component. In other words, the copied database comprises only those rows of the original simulation database for which the component pattern bit string ω contains only a single '1', all other bits being '0'. The database copy preferably is sorted on the test pattern column. The sorting produces a sorted database in which all rows with a given test pattern bit string Δ are adjacent to one another. The adjacent rows with a given test pattern are called a group or sequence. Each such group or sequence of adjacent rows having identical test pattern bit strings Δ begins at an i-th row. A next sequence in the sorted database begins at a j-th row. Copying and sorting are not essential since other embodiments of the present invention can be realized without theses steps, as one skilled in the art will readily recognize. However, copying and sorting result in a more efficient implementation of the method 100, and in particular, copying and sorting, as described hereinabove, assist in performing later steps in the example.

Determining 120 probabilities of correct and incorrect diagnoses continues by examining each of the sequences. For each sequence, in turn, a row is identified having a largest value for the number of occurrences v. A position number of the single BAD component in the component pattern for that row is then referred to as d. Note that copying the database, as described above, has insured that each component pattern in the copied database has one and only one BAD component. Thus, a unique position number may always be assigned to d for each sequence by following the approach outlined hereinabove.

Next, if the test pattern bit string Δ of the sequence being examined has no failed tests (i.e., $\Delta_k=0 \forall k=1, \ldots, m$) perform the following operations for each row r in the sequence of rows i to j−1. First, set a variable b equal to the BAD component position number of row r. Second, set a variable $v_r$ equal to the number of occurrences v of the row r. Third, let a current value of M(m+1, b) equal a former value of M(m+1, b) plus $v_r$ (i.e., M(m+1, b)=M(m+1, b)+$v_r$). Fourth, let a current value of E equal E plus $v_r$ (i.e., E=E+$v_r$). Thus, if considering the seventh row of Table 1, b=4 and $v_r$=29 where m=14, M(15, 4)=M(15, 4)+29 and E=E+29. On the other hand, if considering row r=1 of Table 1, b=2 and $v_r$=12 so that M(15, 3)=M(15, 3)+12 and E=E+12.

Otherwise, if the test pattern bit string Δ of the sequence being examined has at least one failed test (i.e., $\Delta_k=1$ for one or more k=1, . . . , m) perform the following operations for each row r in the sequence of rows i to j−1. First, set a variable b equal to the BAD component position number of row r. Second, set a variable $v_r$ equal to the number of occurrences v of the row r. Third, let a current value of M(d, b) equal a former value of M(d, b) plus $v_r$ (i.e., M(d, b)=M(d, b)+$v_r$). Fourth, let a current value of E equal E plus $v_r$ (i.e., E=E+$v_r$). Thus, if considering the second row of Table 1 where b=2 and $v_r$=149, M(d, 2)=M(d, 2)+149 and E=E+149. On the other hand, if considering row r=6 of Table 1, b=3 and $v_r$=24 so that M(d, 3)=M(d, 3)+24 and E=E+24. The value of d, of course, depends on finding a row in a sequence within the sorted databases (not shown) that has a highest value of number of occurrences $v_r$ as previously described.

Once each sequence has been examined a probability of producing a correct diagnosis may be calculated. To calculate the probability of correct diagnosis let $P_{corr}$ equal a sum of diagonal elements of the matrix M. Then, divide the sum $P_{corr}$ by the accumulated total number of occurrences E. In other words, let $P_{corr}=0$, for i=1, . . . , m, perform $P_{corr}=P_{corr}+M(i,i)$, and then let $P_{corr}=P_{corr}/E$.

The matrix M thus filled is used to create 130 a list of tests to suggest. In particular, a set of the s largest elements of M, excluding diagonal elements is found. Thus, if s =3 is the number of suggested tests to be included in the list, the M matrix is examined and the three elements M(d,b), d≠b, having the three largest values are found. Preferably, the s elements, once found, are ordered and processed in descending value of M(d,b). For each of the s elements M(d,b) perform the following. First, if d≦m, set a 'Low Coverage' field of a suggested test to component d, otherwise (i.e., when d=m+1) set the low coverage field to 'don't care'. Second, set a 'High Coverage' field of the suggested test to component b. Third, set a 'score' field of the suggested test to a value computed by dividing the element value M(d,b) by the total occurrences E (i.e., Score=M(d,b)/E). Fourth, write the suggested test to an output such as a display or a machine-readable file in memory.

For example, consider a sample output of method 100 shown in Table 2. The sample output provides a list of three suggested tests according to the present invention. Each of the suggested tests is represented by a row in Table 2 and comprises a low coverage component, a high coverage component and a score. The low coverage component is either represented by a specific component number (e.g., 2) or is labeled using 'don't care'. The high coverage component is represented by a component number (e.g., 5). The score (e.g., 0.021) is an estimate of an improvement in the probability of correct diagnosis that would occur if the suggested test were added to the test suite. In addition to the list of suggested tests, an estimate of a probability of correct diagnosis (i.e., $P_{corr}$) is included in the sample output of Table 2.

TABLE 2

| Low Coverage | High Coverage | Score |
|---|---|---|
| don't care | 3 | 0.021 |
| 2 | 5 | 0.021 |
| 1 | 6 | 0.017 |

Estimated Probability of correct diagnosis = 0.879

Figure 2:
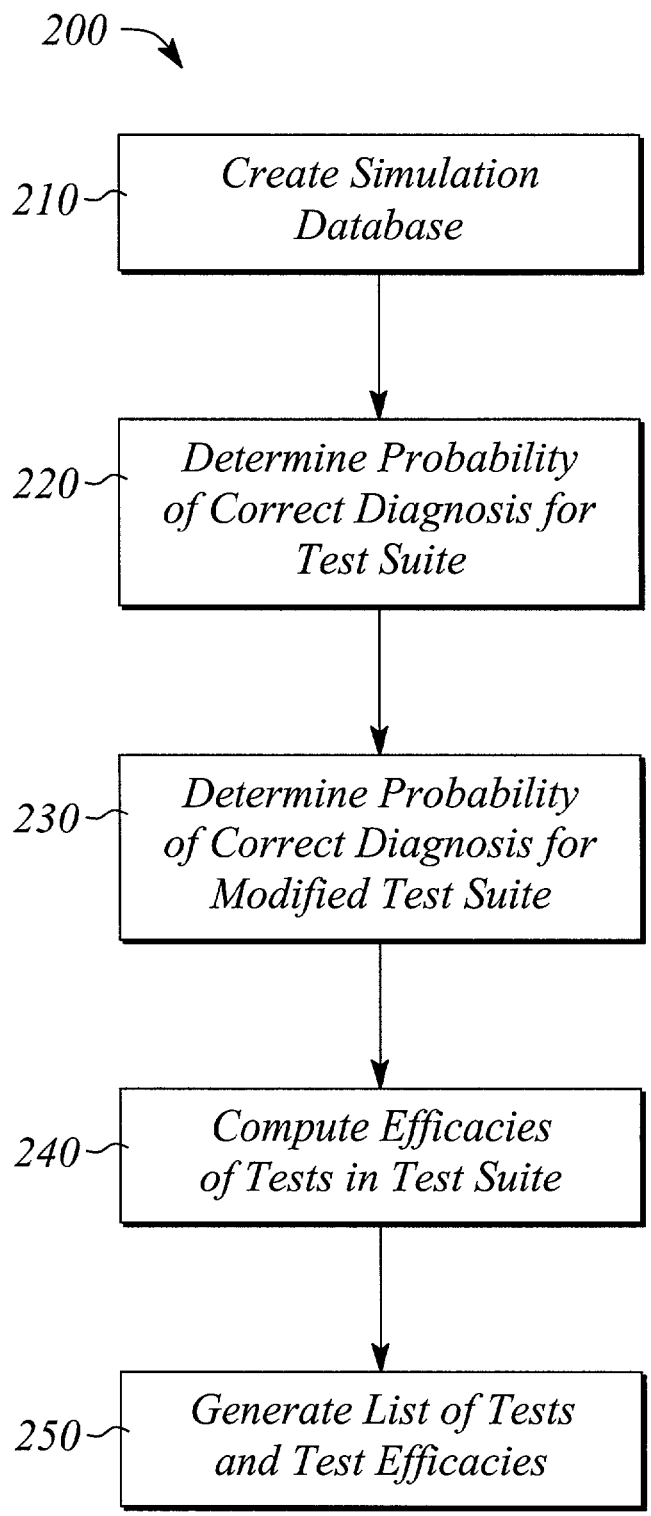
FIG. 2 illustrates a flow chart of a method of identifying a test to delete from a test suite of a diagnostic testing system according to an embodiment of the present invention.

In another aspect of the invention, a method 200 of identifying a test to delete from a test suite is provided. FIG. 2 illustrates a flow chart of the method 200 of identifying tests to delete. The method 200 advantageously determines diagnostic efficacy of tests in a test suite. The method 200 of identifying generates a list of tests, each test being associated with a relative diagnostic efficacy. The generated list is used to identify one or more tests in a test suite that may be deleted. In particular, tests that are in some way redundant or do not otherwise significantly contribute to an overall diagnostic accuracy or efficacy of the test suite may be eliminated. The method 200 quantifies a relative diagnostic efficacy making it possible to identify tests that may be safely deleted from a test suite.

The method 200 of identifying tests to delete comprises creating 210 a simulation database for a DUT and a test suite T. A computer model of the DUT or actual failure data for the DUT, or a combination thereof are employed to create 210 the simulation database. Creating 210 a simulation database is essentially identical to creating 110 a simulation database described hereinabove with respect to method 100. Likewise, as with creating 110 in the method 100, in a preferred embodiment of method 200, a model-based simulation is performed to create 210 the simulation database.

The method 200 further comprises determining 220 a probability of correct diagnosis $P_{corr}$ for the test suite T. The probability of correct diagnosis $P_{corr}$ may be determined 220, as described hereinabove with respect to method 100. In particular, determining 220 comprises counting a number of occurrences of each of the correct diagnoses included in the simulation database. A probability of a given diagnosis may be computed from the count by dividing the number of occurrences of the diagnosis by a total number of occurrences of all diagnoses included in the determination 220. In some embodiments, the probability of incorrect diagnoses is determined also.

The method 200 further comprises determining 230 a probability of correct diagnosis $P_{corr,t}$ for a modified test suite T. The modified test suite T is a test suite including all tests but a selected test t of the test suite T, (i.e., t∈T and t∉T) The probability of correct diagnosis $P_{corr,t}$ for the modified test suite T may be determined in a manner analogous to that used in determining 220 for the test suite T. Preferably, determining 230 a probability of correct diagnosis $P_{corr,t}$ is repeated for m different modified test suites T wherein m is a number of tests in the test suite T and each different modified test suite T is associated with a different selected test t. Thus, a unique probability of correct diagnosis $P_{corr,t}$ is determined 230 for each of m modified test suites T associated with m different tests t.

The method 200 further comprises computing 240 an efficacy value for each of the tests in the test suite T. The efficacy value $\epsilon(t)$ is a metric that relates the diagnostic accuracy or effectiveness of a particular modified test suite T to the test suite T. A preferred metric $\epsilon(t)$ for a given test t is a difference between the determined 230 probability of a correct diagnosis $P_{corr,t}$ and the determined 220 probability of correct diagnosis $P_{corr,t}$ (i.e., $\epsilon(t)=P_{corr,t}-P_{corr}$). In some embodiments, a cost c(t) associated with a test t may also be incorporated in the efficacy value metric $\epsilon(t)$. For example, the cost c(t) of a test t may be incorporated by multiplying the difference between probabilities of correct diagnoses by the cost (i.e., $\epsilon(t)=c(t)\cdot(P_{corr,t}-P_{corr})$)

The method 200 further comprises generating 250 a list of the tests and associated efficacy values. The generated 250 list may include efficacy values $\epsilon(t)$ for some or all of the tests t in the test suite T. Moreover, the list of tests and associated efficacy values thus generated 250 by the present invention may be represented either in human readable form or in machine-readable form. The human-readable form may take any of several common textual or graphical forms known in the art. The machine-readable form may be used by other computer programs or automated systems. The other computer programs or automated systems may use the list to further modify a test suite or implement a modified test suite, for example.

Among other things, the generated 250 list of tests may be used to identify tests that may be deleted or eliminated from the test suite T. In particular, tests with low efficacy values $\epsilon(t)$ may be deleted from the suite T without significantly reducing the overall diagnostic efficacy of the test suite T. Therefore, using the list, tests with low efficacy values $\epsilon(t)$ may be identified that can be safely deleted from the test suite. While minimally reducing the diagnostic efficacy of the test suite, removal of tests with low efficacy values $\epsilon(t)$ may reduce the time and associated costs of testing the DUT.

To better understand the method 200 of the present invention, consider an example of an implementation of a preferred embodiment of the method 200 using a matrix representation for storing intermediate results generated by the method 200. The use of matrix notation hereinbelow is intended to facilitate discussion and in no way limits the scope of the present invention. In addition, for the purposes of discussion hereinbelow it is assumed that a model of the DUT, its components, test coverages, and a priori probabilities of component failure are available.

A simulation database is created 210 for this example in a form and in a manner analogous to that the example of method 100 described hereinabove. In particular, the database comprises multiple rows, each row having a field for a component pattern ω, a test pattern Δ, and a number of occurrences v. A first copy of the database is produced including only those rows from the simulation database having one BAD component. The first copied database is sorted according to test pattern. As described for method 100, the sorting produces sequences or groups of rows having the same test pattern and each sequence begins at an i-th row and a next sequence begins at a j-th row. A matrix M and a variable E are created and initialized to zero (i.e., M=0 and E=0).

The M matrix is filled and the total occurrence variable E is likewise used to accumulate a count of the total number of occurrences as described hereinabove with respect to method 100. Once each sequence in the first copied database has been examined, a probability of a correct diagnosis is determined 220. To determine 220 the probability of correct diagnosis, let $P_{corr}$ equal a sum of diagonal elements of the M matrix. Then, divide the $P_{corr}$ by the accumulated total number of occurrences E. In other words, let $P_{corr}=0$, for i=1, . . . , m, perform $P_{corr}=P_{corr}+M(i,i)$, and then let $P_{corr}=P_{corr}/E$.

Next a probability of correct diagnoses $P_{corr,t}$ for modified test suites T' associated with each of the tests t in the test suite T is determined 230. In particular, for each test t in the test suite, a modified test suite T' is identified by selecting a test t to remove from the test suite T. Once a test t is selected, a second copied database is produced from the first copied database by first deleting the bit from the each of the test pattern bit strings Δ associated with the selected test t. Then, the second copied database is generated by sequentially copying rows of the first copied database into the second copied database while simultaneously combining together any rows that have identical bit string values for the component pattern ω and the test pattern Δ. In each row in the second database representing a set of combined rows, the number of occurrence value v is the sum of the number of occurrence values v for the combined rows.

For example, consider five rows of a first copied database as shown in Table 3.

TABLE 3

| Component Pattern | Test Pattern | Number of Occurrences |
| --- | --- | --- |
| 0010000 | 01100101010101 | 12 |
| 0010000 | 01000101010101 | 149 |
| 0010000 | 00100010010101 | 35 |
| 0010000 | 01100010000101 | 15 |
| 0010000 | 00000010010101 | 178 |

If a third test t is selected, then a third bit $\Delta_3$ of each of the test patterns Δ is deleted. Upon deleting the third bit $\Delta_3$ of each test pattern Δ, it is evident that a first and a second row in Table 3 have identical component and test patterns. Likewise a third and a fifth row of Table 3 have identical component and test patterns. A portion of a second copied database corresponding to the rows shown in Table 3 is shown in Table 4. Note that the number of occurrence values for the combined rows is the sum of the number occurrence values of the individual rows prior to combining and copying.

TABLE 4

| Component Pattern | Test Pattern | Number of Occurrences |
| --- | --- | --- |
| 0010000 | 0100101010101 | 161 |
| 0010000 | 0000010010101 | 213 |
| 0010000 | 0100010000101 | 15 |

A probability of correct diagnosis $P_{corr,t}$ for each test t may then be computed, as was done for the case of the test suite T in which the M matrix was filled, except that for the correct diagnosis $P_{corr,t}$, the matrix M is filled from the second copied database representing the modified test suite T' for each test t. Alternatively, a simpler approach to computing the probability of correct diagnosis $P_{corr,t}$ for each test t comprises performing the following operations. First, initialize a variable $S_t$ to equal 0 (i.e., $S_t=0$). Second loop through the rows of the other second database and sum a largest number of occurrences value $v_{max}$ found for each unique test pattern value Δ with a current value of the variable $S_t$ (i.e., $S_t=S_t+v_{max}$ for each unique test pattern Δ). The probability of correct diagnosis $P_{corr,t}$ for the modified test suite T' for test t is then computed by dividing the variable $S_t$ by the total number of occurrences $E_t$ (i.e., $P_{corr,t}=S_t/E_t$). Note that the total number of occurrences $E_t$ is simply the sum of all numbers of occurrences v in the second copied database. Moreover, one skilled in the art will readily recognize that this simpler approach may also be employed to compute the probability of correct diagnosis $P_{corr}$ for the test suite T from the first copied database, if so desired.

A metric ε(t) representing a diagnostic efficacy value of each of the tests t may then be computed 240. In particular for each test t, the metric ε(t) is computed by subtracting from the probability of correct diagnosis $P_{corr,t}$ for the test t the probability of correct diagnosis $P_{corr}$ for the test suite T. A list is generated 250 from the metrics ε(t). An example of such a list is shown in Table 5. The efficacy value ε(t) in the example of method 200 represents a estimated improvement in the diagnostic accuracy of the test suite T. The estimated improvement values are typically negative numbers since in general, deleting a test will reduce the accuracy of the resulting test suite. However, since the reduction in accuracy may be very small compared to the cost of doing the deleted test, the reduction in accuracy may be acceptable in many instances.

TABLE 5

| Test | Est. Improvement |
| --- | --- |
| 1 | −0.105 |
| 2 | −0.106 |
| 3 | −0.132 |
| 4 | −0.138 |

A key advantage of the present invention is that it provides quantitative information upon which to base decisions about which test(s) to add or remove from a test suite. In particular, the present invention effectively 'discovers' problems associated with diagnostic accuracy of a test suite and automatically suggests tests to add to the test suite to address those problems. Moreover, the present invention associates a relative amount of improvement in diagnostic accuracy with suggested tests, facilitating an evaluation of the advantages of adding such tests. Furthermore, the present invention quantifies the efficacy of tests in the test suite, thereby enabling the identification of test(s) that can be removed from a test suite while minimally reducing the effectiveness of the suite. Removing identified tests may result in reducing test time while minimally impacting the effectiveness of the test suite.

The method 100 of suggesting a test to add to a test suite of a diagnostic testing system and/or the method 200 of identifying a test to delete from a test suite of the present invention also may be employed when testing a DUT for which a specific diagnosis of component failure is not needed. For example, in some cases a cost of repair of a DUT is more than the cost of the DUT. In such a case, it is sufficient to determine from testing whether the DUT, as a whole, is GOOD or BAD. However in such cases, it still may be desirable to optimize a given test suite such that the test suite maximizes coverage and minimizes test costs. Test costs are often measured in terms including, but not limited to, test time, cost of test equipment, and/or number of tests. Given the discussion hereinabove, one skilled in the art can readily realize that the method 100 and/or the method 200 can be employed in such a case where a diagnosis beyond a GOOD/BAD determination for the DUT, as a whole, by simply defining the DUT to have a single component, namely the DUT itself.

In particular, for those situations in which no component level diagnosis is to be performed by the testing system, the methods 100 and 200 may be used by simply setting the number of components to equal one. For the examples described hereinabove with respect to methods 100 and 200, after creating 110, 210 a simulation database, set the number of components n equal to one (i.e., n=1). Next, replace the component pattern of each row of the simulation database with a bit string having a single bit equaling '1'. Then continue with the examples as described.

In yet another aspect of the present invention, a system 300 that determines an efficacy of tests in a test suite of a testing system is provided. In some embodiments, the system 300 suggests tests to add to the test suite to improve the overall efficacy and/or accuracy of a testing system employing the test suite. In other embodiments, the system 300' provides an effect on overall efficacy of one or more tests in the test suite and facilitates identification of test that may be deleted from the test suite with minimal reduction in the overall efficacy of the testing system. In yet other embodiments, the system 300, 300' may provide a combination of suggested tests to add and an identification of tests to delete.

Figure 3:
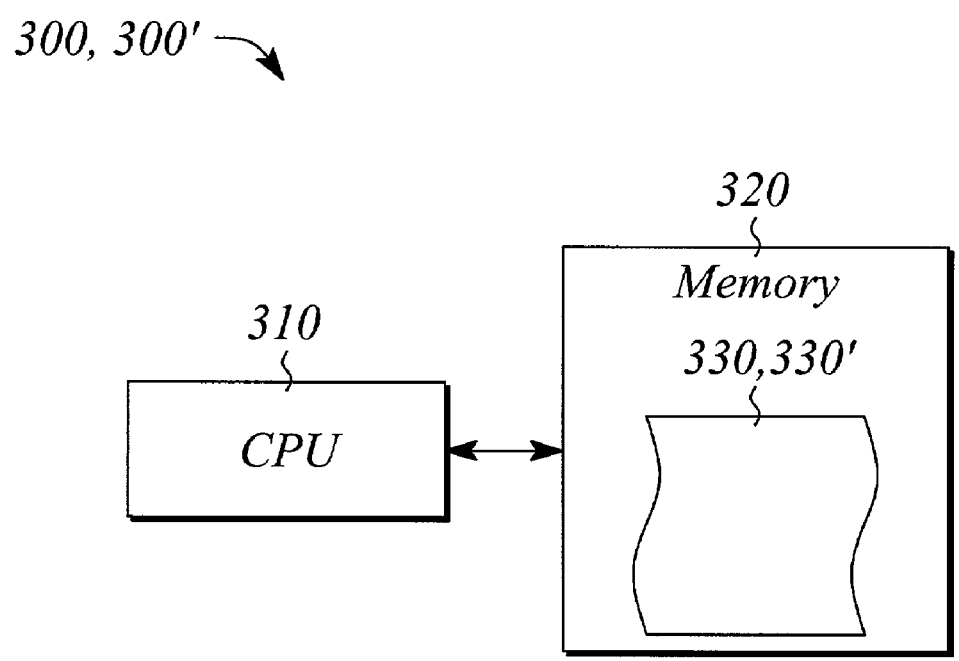
FIG. 3 illustrates a schematic block diagram of a system that determines a diagnostic efficacy of a test suite of a diagnostic testing system according to embodiments of the present invention.

FIG. 3 illustrates a block diagram of the system 300, 300', 300" of the present invention. The system 300, 300', 300" comprises a processor (CPU) 310, a memory 320 and a computer program 330, 330' stored in the memory 320. The CPU 310 accesses the computer program 330, 330', 330" from memory and executes the computer program 330, 330', 330". The system 300, 300", 300" may be a stand-alone system or may be part of a testing system that employs the test suite to test a DUT.

In a preferred embodiment, the CPU 310 is a general-purpose processor such as a microprocessor or microcontroller capable of executing the computer program 330, 330', 330". However in other embodiments, the CPU 310 may be a specialized processor, such as might be found in an application specific integrated circuit (ASIC). The memory 320 may be any form of computer memory including, but not limited to, random access memory (RAM), read only memory (ROM), and disk memory. In some embodiments, the memory 320 is separate from the CPU 310 while in other embodiments the memory may be incorporated in the CPU 310. As with the CPU 310, the memory may be a portion of an ASIC.

The computer program 330, 330', 330" comprises instructions that, when executed, determine the efficacy of tests in a test suite and one or both suggest tests to add and identify tests to delete from the test suite. In a preferred embodiment, the instructions of the computer program 330 implement the method of determining a revision of a test suite of a model-based diagnostic testing system of the present invention. More preferably, the computer program 330 implements both the method 100 and the method 200 of the present invention.

In particular, the computer program 330, 330' creates a simulation database, determines a probability of correct and incorrect diagnoses, and creates a list of suggested tests to add to the test suite. In the preferred embodiment, the list of suggested tests comprises a user-selected number or quantity of suggested tests. Each suggested test comprises one or more of a component of the DUT identified as needing high coverage in the test to be added, a component of the DUT identified as having low coverage in the test to be added, and a score for the test. The score indicates a relative improvement in an efficacy of the test suite for diagnosing a correct, failed component in the DUT being tested. In addition, a measure of an overall probability of correct diagnosis for the test suite is provided. As for the computer program 330, the computer program 330' preferably implements the method 100 of the present invention.

In another embodiment, the computer program 330, 330", when executed by the CPU 310, creates a simulation database, determines a probability of correct diagnosis for the test suite, determines a probability of correct diagnosis for a modified test suite that excludes a test of the test suite, and computes an efficacy value for the modified test suite. The determination of a probability of correct diagnosis and the computation of the efficacy value for the modified test suite that excludes a test are repeated for more than one modified test suite wherein each different test suite excludes a different test. Preferably, an efficacy value associated with every test in the test suite is computed. The computer program 330, 330" also generates a list of tests and their relative effect on overall test suite efficacy. The list may be used to identify tests to delete from the test suite. As for the computer program 330, the computer program 330" preferably implements the method 200 of the present invention.

Thus, there has been described a novel method 100, 200 of determining a revision of a test suite of a model-based diagnostic testing system. In addition, a system 300, 300', 300" that determines an efficacy of tests in a test suite and either or both suggests tests to add and identifies tests to delete from the test suite has been described. It should be understood that the above-described embodiments are merely illustrative of the some of the many specific embodiments that represent the principles of the present invention. Clearly, those skilled in the art can readily devise numerous other arrangements without departing from the scope of the present invention.

What is claimed is:

1. A method of determining a revision of a test suite of a model-based diagnostic testing system comprising:
evaluating a diagnostic efficacy of the test suite using a probability of one or both of a correct diagnosis and an incorrect diagnosis by the test suite, wherein evaluating comprises:
suggesting a test to add to the test suite to adjust an overall test coverage of the test suite, wherein suggesting a test to add comprises:
creating a simulation database of the test suite;

determining a probability of a correct diagnosis and a probability of an incorrect diagnosis for the test suite using the database; and creating a list of suggested tests from the determined probabilities; and identifying a test to delete from the test suite that comprises:

determining a probability of a correct diagnosis for a modified test suite using the database, the modified test suite having a selected test removed from the test suite;

computing an efficacy value associated with the selected test using the determined probabilities of a correct diagnosis for the test suite and the modified test suite; and generating a list of deletable tests and associated efficacy values.

2. The method of claim 1, wherein each suggested test on the list comprises a test coverage.

3. A method of determining a revision of a test suite of a model-based diagnostic testing system comprising:

evaluating a diagnostic efficacy of the test suite using a probability of one or both of a correct diagnosis and an incorrect diagnosis by the test suite, wherein evaluating comprises:

identifying a test to delete from the test suite, the deletable test having a minimal effect on an overall diagnostic efficacy of the test suite, wherein identifying a test comprises:

creating a simulation database of the test suite;

determining a probability of a correct diagnosis for the test suite using the database;

determining a probability of a correct diagnosis for a modified test suite using the database, wherein the modified test suite is the test suite having a selected test removed;

computing an efficacy value for the modified test suite using the determined probabilities; and generating a list of deletable tests using the computed efficacy values.

4. The method of claim 3, wherein determining a probability for a modified test suite is repeated for a plurality of modified test suites, each modified test suite of the plurality being the test suite having a different selected test removed.

5. The method of claim 4, wherein the selected test associated with the modified test suite having a low computed efficacy value relative to other modified test suites is the deletable test.

6. The method of claim 3, wherein evaluating further comprises:

suggesting a test to add to the test suite to adjust an overall test coverage of the test suite that comprises;

determining a probability of an incorrect diagnosis for the test suite using the database; and creating a list of tests to add from the determined correct and incorrect probabilities for the test suite.

7. A method of evaluating a diagnostic efficacy of a test suite of a model-based diagnostic testing system comprising:

creating a simulation database of the test suite;

determining a probability of one or both of a correct diagnosis and an incorrect diagnosis for the test suite using the database; and using the determined probability to evaluate the test suite, wherein creating a simulation database comprises:

simulating an application of the test suite to a device under test, the device under test comprising one or more components; and recording a probable result of the application in the simulation database, the simulation database being represented by a table having a plurality of columns and a plurality of rows, the plurality of columns comprising a component pattern, a test result pattern, and a number of occurrences, wherein the component pattern encodes which component is good or bad, each component of the device under test being represented by a unique position number within the component pattern, wherein the test result pattern encodes which of the tests of the test suite failed or passed, each test in the test suite being represented by a unique position within the test result pattern, wherein the number of occurrences represents a number of times that a given combination of the component pattern and the test result pattern occurred during a simulation, the number of occurrences being an integer greater than or equal to zero, and wherein each row of the plurality of rows corresponds to a different unique pattern of good and bad components.

8. The method of claim 7, wherein determining a probability of one or both of a correct diagnosis and an incorrect diagnosis comprises:

copying to a database copy only those rows of the created simulation database with only one bad component in the component pattern column, all other components in the respective row being good;

sorting the database copy based on the test pattern column, such that the rows with a given test pattern are adjacent to one another, the adjacent rows forming a group of rows;

examining each group of rows to locate a row within each group having a largest number of occurrences relative to other rows within the respective group; and assigning a diagnosis d to each group, the diagnosis d being the position number of the bad component for the located row.

9. The method of claim 8, wherein determining a probability of one or both of a correct diagnosis and an incorrect diagnosis further comprises creating and initializing a matrix M such that matrix elements M(i,j) of the matrix M are equal to zero for all i and j, where i is an integer that ranges from one to m+1 and where j is an integer that ranges from one to m, where in is the number of tests in the test suite.

10. The method of claim 9, wherein for each group having a test pattern that represents no failed tests, determining a probability further comprises:

adding iteratively for each row r in the group the number of occurrences value of the row r to a current value of the matrix element M(m+1, b) to generate a next value of the matrix element M(m+1, b), where b is a position number of the bad component for the row r.

11. The method of claim 10, wherein for each group having a test pattern that represents at least one failed test, determining a probability further comprises:

adding iteratively for each row r in the group the number of occurrences value of the row r to a current value of the matrix element M(d, b) to generate a next value of the matrix element M(d, b).

12. The method of claim 11, wherein the determined probability of a correct diagnosis $P_{corr}$ is calculated using $$P_{corr} = \Sigma/E$$

where Σ is a sum of diagonal elements M(i, i) of the matrix M for i equals one to m and E is a sum of all number of occurrence values in the database copy.

13. The method of claim 12, wherein using the determined probability to evaluate the test suite comprises:
   suggesting a test to add to the test suite to improve diagnostic efficacy.

14. The method of claim 13, wherein suggesting a test comprises:
   finding a relatively largest value element M(i,j) in the matrix M, where i is not equal to j, the element M(i,j) representing the probability of incorrectly diagnosing component i as the bad component when component j is actually bad; and
   suggesting a test t having high coverage for component i and one of either low coverage for component j, if j is not equal to m+1, or coverage being irrelevant, if j is equal to m+1.

15. The method of claim 14, wherein suggesting a test further comprises creating a list of suggested tests, wherein creating a list comprises:
   repeating finding and suggesting for each element of a set of largest value elements M(i,j), a test being suggested for each element of the set of elements M(i,j); and
   computing a score for each of the suggested tests, the score being computed by dividing the element value M(i,j) by the total accumulated number of occurrences E.

16. The method of claim 15, wherein the list of suggested tests is represented in one or both of human readable form or machine-readable form.

17. The method of claim 12, wherein using the determined probability to evaluate the test suite comprises:
   identifying a test of the test suite that may be deleted front the test suite.

18. The method of claim 17, wherein for identifying a test t to delete from the test suite, the method further comprises:
   determining a probability of a correct diagnosis $P_{corr,t}$ for a modified test suite using the database, the modified test suite having a selected test t removed from the test suite;
   computing an efficacy value for the modified test suite using the determined probabilities for the test suite and for the modified test suite; and
   generating a list of deletable tests, the deletable tests having a lowest associated efficacy relative to efficacies of other tests in the test suite.

19. The method of claim 18, wherein determining a probability of a correct diagnosis $P_{corr,t}$ for a modified test suite associated with each of the tests t in the test suite comprises using a modified database created from the database copy, wherein the modified database is created comprising:
   copying the database copy into another database copy;
   selecting a test t to remove from the test suite;
   deleting a position from each test pattern associated with the selected test t from the other database copy; and
   copying rows of the other database copy into a modified database, such that any rows that have identical values for the component pattern and the test pattern are combined together in the modified database,
   wherein in each row of the modified database that represents a set of combined rows from the other database copy the number of occurrences is a sum of the number of occurrence values for the combined rows.

20. The method of claim 19, wherein the probability of a correct diagnosis $P_{corr,t}$ for each of the modified test suites is determined in a manner analogous to determining the probability of a correct diagnosis $P_{corr}$ for the test suite.

21. The method of claim 19, wherein determining a probability of a correct diagnosis $P_{corr,t}$ for the modified test suite T' using the modified database comprises:
   summing a largest number of occurrences value $v_{max}$ found for each unique test pattern value within the modified database; and
   dividing the $v_{max}$ sum by a total number of occurrences $E_t$, where the total number of occurrences $E_t$ is the sum of all numbers of occurrences in the modified database.

22. The method of claim 18, wherein computing an efficacy value for each of the tests in the test suite comprises computing a difference between the determined probability of a correct diagnosis $P_{corr,t}$ for the modified test suite corresponding to a selected test t and the determined probability of a correct diagnosis $P_{corr}$ for the test suite.

23. The method of claim 22, wherein the computed efficacy ε(t) value further comprises a cost metric c(t) associated with the test t, where $\epsilon(t)=c(t)\cdot(P_{corr,t}-P_{corr})$.

24. The method of claim 22, wherein the generated list of deletable tests comprises an associated efficacy value for each of the deletable tests.

25. The method of claim 18, wherein the generated list is represented in one or both of human readable form and in machine-readable form.

26. The method of claim 7, wherein the created simulation database comprises a Monte Carlo simulation of a model of the device under test.

27. A system that determines efficacy of a test suite of a model-based diagnostic testing system comprising:
   a processor;
   a memory; and
   a computer program stored in the memory and executed by the processor, wherein the computer program comprises instructions that, when executed by the processor, implement evaluating the test suite using a probability of one or both of a correct diagnosis and an incorrect diagnosis by the test suite to determine the efficacy, wherein the instructions that implement evaluating the test suite implement;
   creating a simulation database of the test suite;
   determining a probability of one or both of a correct diagnosis and an incorrect diagnosis using the database;
   using the determined probability to evaluate the test suite; and
   determining a probability of a correct diagnosis for a modified test suite using the database, the modified test suite having a selected test removed from the test suite;
   and wherein using the determined probability comprises;
   computing an efficacy value for the modified test suite using the determined probability of a correct diagnosis for both the test suite and the modified test suite; and
   generating a list of tests to delete from the test suite based on the computed efficacy value.

28. The system of claim 27, wherein using the determined probability of both a correct diagnosis and an incorrect diagnosis comprises creating a list of suggested tests to add to the test suite, each suggested test having an associated test coverage.

29. The system of claim 27, wherein determining a probability of a correct diagnosis for a modified test suite is repeated for different modified test suites, each different modified test suite having an associated different selected test being removed.

30. A system that determines efficacy of a test suite of a model-based diagnostic testing system comprising:

a processor;

a memory; and a computer program stored in the memory and executed by the processor, wherein the computer program comprises instructions that, when executed by the processor, implement evaluating the test suite using a probability of one or both of a correct diagnosis and an incorrect diagnosis by the test suite to determine the efficacy, wherein the instructions that implement evaluating the test suite implement one or both of suggesting a test to add to the test suite and identifying a test to delete from the test suite, wherein suggesting a test to add to the test suite and identifying a test to delete from the test suite each comprise a list of respective tests, the lists being represented in one or both of human readable form and machine-readable form.

* * * * *

UNITED STATES PATENT AND TRADEMARK OFFICE
CERTIFICATE OF CORRECTION

PATENT NO. : 7,139,676 B2  Page 1 of 1
APPLICATION NO. : 10/053748
DATED : November 21, 2006
INVENTOR(S) : Barford It is certified that error appears in the above-identified patent and that said Letters Patent is hereby corrected as shown below:

In column 17, line 52 (Approx.), in Claim 6, after "comprises" delete ";" and insert -- : --, therefor.

In column 18, line 47 (Approx.), in Claim 9, after "where" delete "in" and insert -- m--, therefor.

In column 19, line 34, in Claim 17, after "a test" insert -- t --.

In column 19, line 34, in Claim 17, delete "front" and insert -- from --, therefor.

In column 20, line 10, in Claim 21, after "Et" delete ",".

In column 20, line 41, in Claim 27, after "implement" delete ";" and insert -- : --, therefor.

In column 20, line 50, in Claim 27, after "comprises" delete ";" and insert -- : --, therefor.

Signed and Sealed this

Fifteenth Day of April, 2008

JON W. DUDAS
*Director of the United States Patent and Trademark Office*